United States Patent
Kurakane

(10) Patent No.: US 9,520,316 B2
(45) Date of Patent: Dec. 13, 2016

(54) SEPARATION DEVICE AND PICKUP SYSTEM

(71) Applicant: TESEC Corporation, Tokyo (JP)

(72) Inventor: Takashi Kurakane, Tokyo (JP)

(73) Assignee: TESEC Corporation, Tokyo (JP)

( * ) Notice: Subject to any disclaimer, the term of this patent is extended or adjusted under 35 U.S.C. 154(b) by 0 days.

(21) Appl. No.: 14/493,034

(22) Filed: Sep. 22, 2014

(65) Prior Publication Data

US 2015/0083344 A1 Mar. 26, 2015

(30) Foreign Application Priority Data

Sep. 26, 2013 (JP) .................................. 2013-199287

(51) Int. Cl.
*H01L 21/683* (2006.01)
*B32B 38/10* (2006.01)
*H01L 21/67* (2006.01)

(52) U.S. Cl.
CPC ..... *H01L 21/6836* (2013.01); *H01L 21/67132* (2013.01); *H01L 21/6838* (2013.01); *B32B 2457/14* (2013.01); *H01L 2221/68322* (2013.01); *H01L 2221/68386* (2013.01); *Y10S 156/932* (2013.01); *Y10S 156/943* (2013.01); *Y10T 156/1132* (2015.01); *Y10T 156/1944* (2015.01); *Y10T 156/1978* (2015.01); *Y10T 156/1983* (2015.01)

(58) Field of Classification Search
CPC ........... H01L 21/67132; H01L 27/6838; H01L 2221/68322; H01L 2221/68336; H01L 2221/68381;H01L 2221/68386; B32B 43/006; Y10T 156/1132; Y10T 156/1179; Y10T 156/1944; Y10T 156/1983; Y10S 156/932; Y10S 156/943

See application file for complete search history.

(56) References Cited

U.S. PATENT DOCUMENTS

| | | | | |
|---|---|---|---|---|
| 6,561,743 | B1 * | 5/2003 | Nakatsu | H01L 21/67132 156/750 |
| 6,824,643 | B2 * | 11/2004 | Yoshimoto | H01L 21/67132 156/716 |
| 7,238,593 | B2 * | 7/2007 | Medding | H01L 21/67132 438/106 |
| 7,240,422 | B2 * | 7/2007 | Cheung | H01L 21/67132 156/765 |

(Continued)

FOREIGN PATENT DOCUMENTS

JP 06-236916 A 8/1994

*Primary Examiner* — Mark A Osele
(74) *Attorney, Agent, or Firm* — Robert C. Kowert; Meyertons, Hood, Kivlin, Kowert & Goetzel, P.C.

(57) ABSTRACT

A separation device includes a mount table, projecting portion, and drawing port. The mount table includes a mount surface on which a pressure sensitive adhesive sheet, on which an electronic component is stuck, is mounted. The electronic component is stuck on one surface of the pressure sensitive adhesive sheet, and the mount surface is in contact with the other surface of the pressure sensitive adhesive sheet. The projecting portion is formed on the mount surface and projects toward the pressure sensitive adhesive sheet mounted on the mount surface. The drawing port is open near the projecting portion on the mount surface, and when a negative pressure is applied, draws the pressure sensitive adhesive sheet.

7 Claims, 7 Drawing Sheets

(56) References Cited

U.S. PATENT DOCUMENTS

| | | | | |
|---|---|---|---|---|
| 7,757,742 B2* | 7/2010 | Cheung | ............ | H01L 21/67132 |
| | | | | 156/66 |
| 7,820,006 B2* | 10/2010 | Umehara | .......... | H01L 21/67126 |
| | | | | 156/65 |
| 8,092,645 B2* | 1/2012 | Yip | ................... | H01L 21/67132 |
| | | | | 156/707 |
| 8,141,612 B2* | 3/2012 | Chan | ................. | H01L 21/67132 |
| | | | | 156/707 |
| 2002/0129899 A1* | 9/2002 | Mimata | ............ | H01L 21/67132 |
| | | | | 156/707 |

* cited by examiner

RELATED ART

SEPARATION DEVICE AND PICKUP SYSTEM

BACKGROUND OF THE INVENTION

The present invention relates to a separation device which separates, from a pressure sensitive adhesive sheet, an electronic component stuck on the pressure sensitive adhesive sheet, and a pickup system including the separation device.

There has been proposed a system which picks up an electronic component from a pressure sensitive adhesive sheet on which a plurality of electronic components are stuck, and inspected or stored in a predetermined container. Japanese Patent Laid-Open No. 6-236919 (literature 1) has disclosed a technique associated with this system. As shown in FIG. 13, this system includes a flat plate-like suction stage 901 on which a pressure sensitive adhesive sheet is mounted. The suction stage 901 includes an opening 902 formed at almost the center of the suction stage 901, and a push-up pin 903 which projects from the opening 902.

When picking up an electronic component stuck on a pressure sensitive adhesive sheet, first, the pressure sensitive adhesive sheet is mounted on the suction stage 901 with a surface, on which no electronic component is stuck, facing down, and an electronic component to be picked up is arranged on the opening 902. In this state, as shown in FIG. 14 an electronic component D is pushed up by the push-up pin 903 via a pressure sensitive adhesive sheet S, separating the electronic component D from the pressure sensitive adhesive sheet S. The electronic component D is then picked up by a collet or the like.

However, in the above-described related art, the electronic component D is pushed up by the push-up pin 903, so a shock is applied to the electronic component D to damage it in some cases.

SUMMARY OF THE INVENTION

It is an object of the present invention to provide a separation device and pickup system capable of separating a pressure sensitive adhesive sheet without damaging an electronic component.

There is provided a separation device comprising a mount table including a mount surface on which a pressure sensitive adhesive sheet, on which an electronic component is stuck, is mounted, the electronic component being stuck on one surface of the pressure sensitive adhesive sheet and the mount surface being in contact with the other surface of the pressure sensitive adhesive sheet, a projecting portion which is formed on the mount surface and projects toward the pressure sensitive adhesive sheet mounted on the mount surface, and a drawing port which is open near the projecting portion on the mount surface, and when a negative pressure is applied, draws the pressure sensitive adhesive sheet.

There is provided a pickup system comprising a holding device which movably holds a pressure sensitive adhesive sheet having one surface on which an electronic component is stuck, a separation device which separates the electronic component from the pressure sensitive adhesive sheet, and a suction device which sucks the electronic component separated by the separation device, the separation device including a mount table including a mount surface on which the pressure sensitive adhesive sheet is mounted to bring the other surface of the pressure sensitive adhesive sheet into contact with the mount surface, a projecting portion which is formed on the mount surface and projects toward the pressure sensitive adhesive sheet mounted on the mount surface, and a drawing port which is open near the projecting portion on the mount surface, and when a negative pressure is applied, draws the pressure sensitive adhesive sheet.

DESCRIPTION OF THE PREFERRED EMBODIMENT

An embodiment of the present invention will now be described in detail with reference to the accompanying drawings.

[Arrangement of Pickup System]

Figure 1:
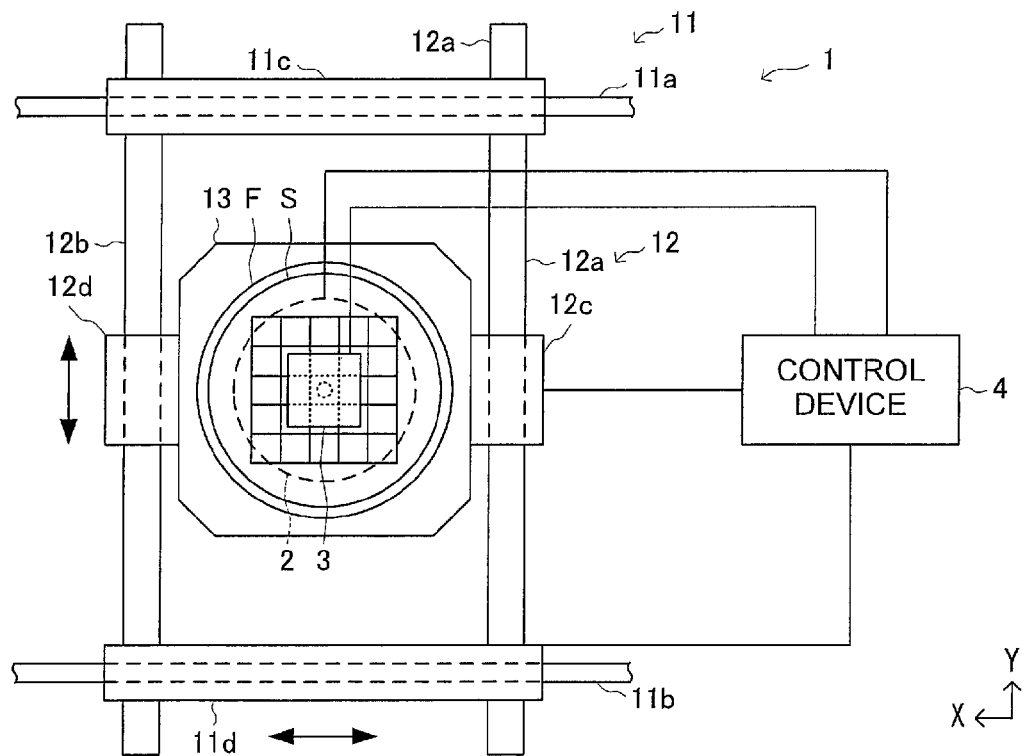
FIG. 1 is a plan view showing the overall arrangement of a pickup system.
Figure 2:
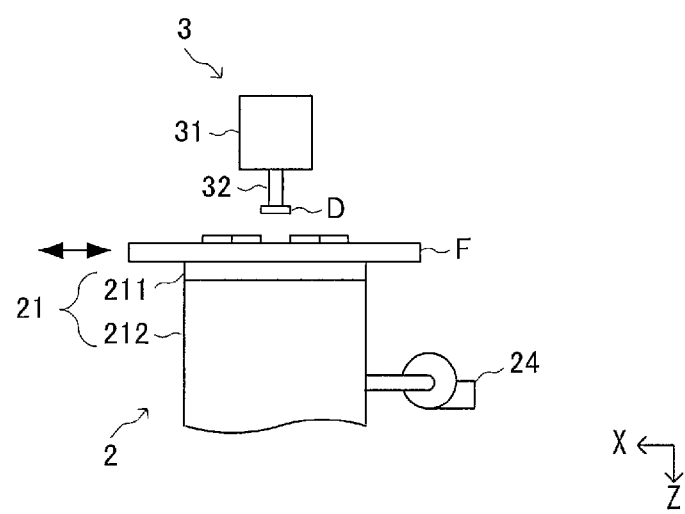
FIG. 2 is a front view showing the overall arrangement of the pickup system.

A pickup system shown in FIGS. 1 and 2 includes a holding device 1, separation device 2, suction device 3, and control device 4. The holding device 1 is configured to movably hold a wafer sheet (pressure sensitive adhesive sheet) S having one surface on which an electronic component D is stuck. The separation device 2 is configured to separate, from the wafer sheet S, at least part of the electronic component D stuck on one surface of the wafer sheet S. In other words, the separation device 2 separates at least part of the wafer sheet S sticking to the electronic component D. The suction device 3 is configured to suck the electronic component D at least partially separated by the separation device 2. The control device 4 is configured to control the operation of the overall pickup system.

For descriptive convenience, a direction in which the electronic component D is moved to separate the wafer sheet S by the separation device 2 will be defined as an "X-axis direction" (first direction). A direction perpendicular to the X-axis direction will be defined as a "Y-axis direction" (second direction). A direction perpendicular to the X-axis direction and Y-axis direction will be defined as a "Z-axis direction". In the embodiment, a horizontal plane is constituted by the X- and Y-axes. That is, the X-axis direction and Y-axis direction are horizontal directions, and the Z-axis direction is a vertical direction.

<Arrangement of Holding Device 1>

The holding device 1 includes an X moving mechanism 11 which moves in the X-axis direction, a Y moving mechanism 12 which is fixed to the X moving mechanism 11 and moves in the Y-axis direction, and a holding unit 13 which is fixed to the Y moving mechanism 12 and holds a wafer frame F.

The X moving mechanism 11 includes a pair of X rails 11a and 11b, and X moving units 11c and 11d. The X rails 11a and 11b are rod-like rails which extend in the X-axis direction and are disposed at a predetermined interval in the Y-axis direction. The X moving units 11c and 11d are attached to the X rails 11a and 11b, respectively, extend along the X rails 11a and 11b, and move along the X rails 11a and 11b.

The Y moving mechanism 12 includes a pair of Y rails 12a and 12b, and Y moving units 12c and 12d. The Y rails 12a and 12b are formed from rod-like members extending in the Y-axis direction. One end and the other end of the Y rail 12a are fixed to one end of the X moving unit 11c and one end of the X moving unit 11d, respectively. One end and the other end of the Y rail 12b are fixed to the other end of the X moving unit 11c and the other end of the X moving unit 11d, respectively. The Y moving units 12c and 12d are attached to the Y rails 12a and 12b, respectively, and move along the Y rails 12a and 12b.

The holding unit 13 is formed from a plate-like member which has an opening formed at the center to fix the wafer frame F, and has a rectangular shape when viewed from the top. One side surface of the holding unit 13 is fixed to the Y moving unit 12c, and the other side surface of the holding unit 13 that is face to face with one side surface is fixed to the Y moving unit 12d.

The wafer frame F held by the holding unit 13 supports the wafer sheet S. The wafer sheet S is formed from an elastic material, one surface (to be also referred to as an "upper surface" hereinafter) of the wafer sheet S has adhesion, and the other surface (to be also referred to as a "lower surface" hereinafter) does not have adhesion. A plurality of plate-like electronic components D with a rectangular shape when viewed from the top are stuck in a matrix on the adhesive upper surface.

In the holding device 1 having this arrangement, when the X moving units 11c and 11d move in the X-axis direction along the X rails 11a and 11b, the Y rails 12a and 12b fixed to the X moving units 11c and 11d, the Y moving units 12c and 12d attached to the Y rails 12a and 12b, and the holding unit 13 fixed to the Y moving units 12c and 12d also move in the X-axis direction. As a result, the wafer frame F held by the holding unit 13 moves in the X-axis direction.

When the Y moving units 12c and 12d move in the Y-axis direction along the Y rails 12a and 12b, the holding unit 13 fixed to the Y moving units 12c and 12d also moves in the Y-axis direction. As a result, the wafer frame F moves in the Y-axis direction.

In this way, the holding device 1 can move the wafer frame F held by the holding unit 13 in the X-axis direction and Y-axis direction.

Note that the holding device 1 may further include a Z moving mechanism which moves the X rails 11a and 11b in the Z-axis direction. The Z moving mechanism is constituted by, e.g., a pair of Z rails and a pair of Z moving units. The Z rails are disposed near the X rails 11a and 11b, respectively, and extend in the Z-axis direction. The Z moving units are movably attached to the Z rails, respectively, and the neighboring X rails 11a and 11b are fixed to the Z moving units, respectively. With this Z moving mechanism, the wafer frame F held by the holding unit 13 can be moved even in the Z-axis direction.

<Arrangement of Separation Device 2>

As shown in FIGS. 2 to 6, the separation device 2 includes a mount table 21 including a mount surface 211a on which the wafer sheet S is mounted, a projecting portion 22 which is fixed on the mount surface 211a and projects toward the wafer sheet S mounted on the mount surface 211a, and a drawing port 23 which is open near the projecting portion 22 on the mount surface 211a, and when a negative pressure is applied, sucks (draws) the wafer sheet S. A drawing pump 24 is connected to the mount table 21.

Figure 3:
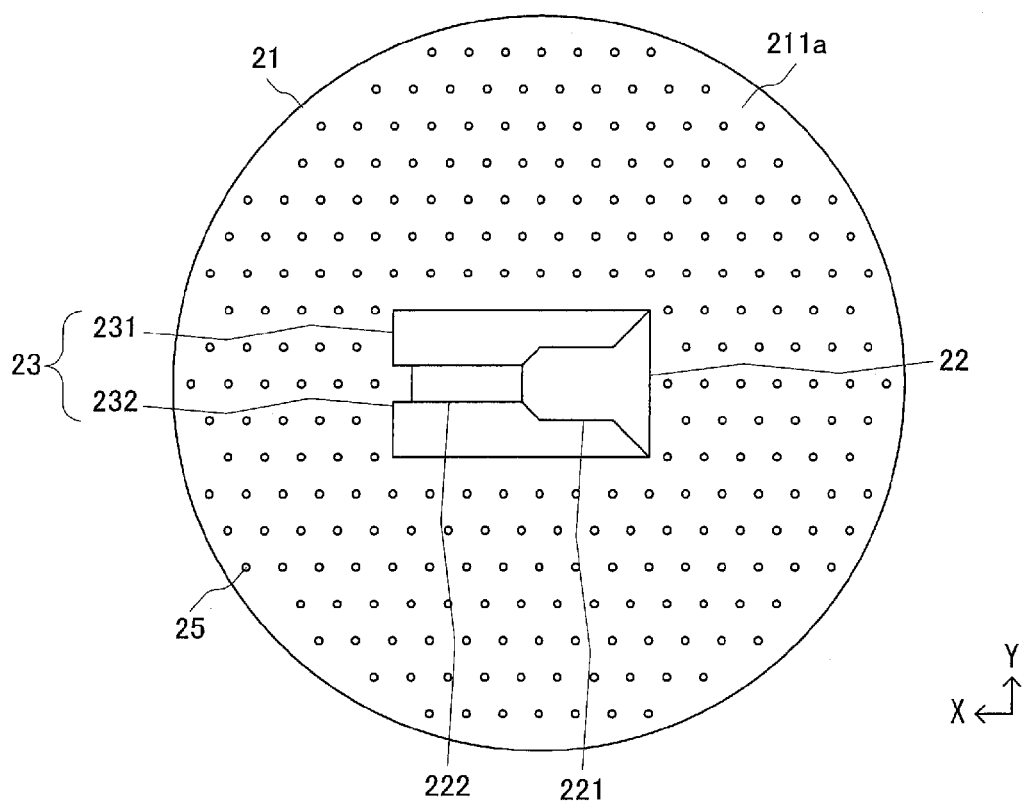
FIG. 3 is a plan view showing a separation device.
Figure 4:
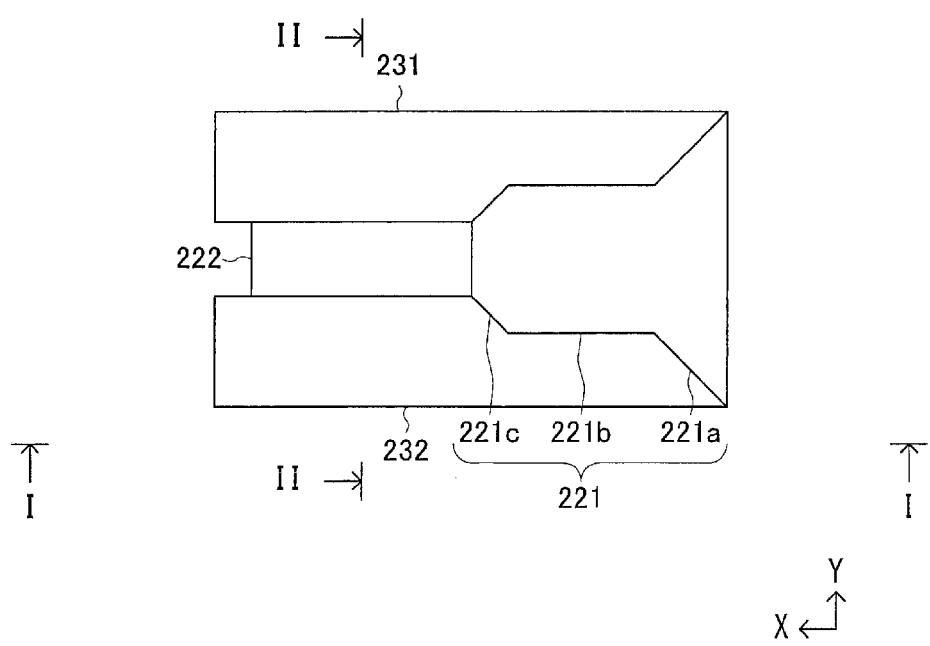
FIG. 4 is a plan view showing the main part of the separation device.

The mount table 21 is constituted by a mount plate 211 formed into a disk shape, and a cylindrical base 212 which is formed into a cylindrical shape and has an upper opening closed by the lower surface of the mount plate 211. The upper surface of the mount plate 211 serves as the above-described mount surface 211a. As shown in FIGS. 3 and 4, the projecting portion 22 and drawing port 23 are formed at the center of the mount surface 211a (mount plate 211). Many (a plurality of) pores 25 are formed in the entire mount surface 211a (mount plate 211). In the drawings other than FIG. 3, the pores 25 are not illustrated. In the embodiment, the mount surface 211a is horizontal and is parallel to the X-axis direction and Y-axis direction.

Figure 5:
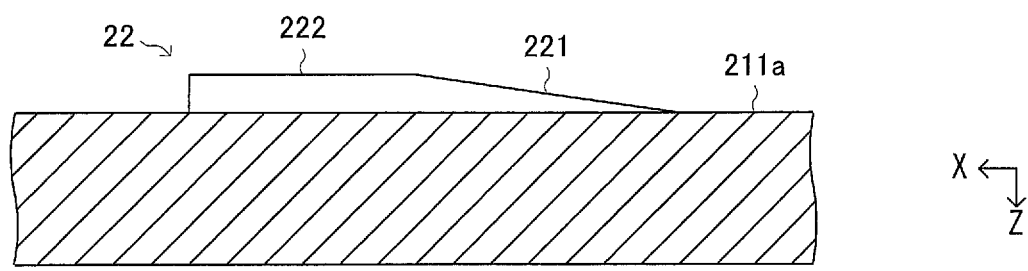
FIG. 5 is a sectional view taken along a line I-I in FIG. 4.
Figure 6:
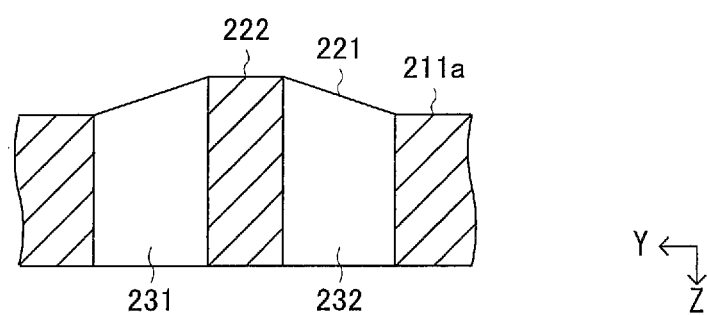
FIG. 6 is a sectional view taken along a line II-II in FIG. 4.

The projecting portion 22 extends in the X-axis direction. The projecting amount (height) of the projecting portion 22 monotonically increases in the X-axis direction. In the embodiment, as shown in FIG. 5, the projecting portion 22 is constituted by a sloped portion 221 which has one end continuing from the mount surface 211a and has a predetermined gradient, and a flat portion 222 which continues from the other end of the sloped portion 221 and is parallel to the mount surface 211a.

As shown in FIG. 4, the length (to be also referred to as a "width" hereinafter) of the upper surface of the projecting portion 22 in the Y-axis direction monotonically decreases in the X-axis direction. In the embodiment, the upper surface of the sloped portion 221 is constituted by a first region 221a which continues from the mount surface 211a and is tapered when viewed from the top, a second region 221b which continues from the first region 221a and has a constant width, and a third region 221c which is formed between the second region 221b and the flat portion 222 and is tapered when viewed from the top. The upper surface of the flat portion 222 is formed into a rectangular shape with a constant width when viewed from the top.

The width of at least part of the projecting portion 22 is formed to be smaller than the width of the electronic component D. In the embodiment, the first region 221a except for this part is formed to have a width smaller than that of the electronic component D.

The aforementioned "monotonic increase" and "monotonic decrease" mean "monotonic increase" and "monotonic decrease" in a broad sense. Hence, the projecting portion 22 may include a portion having a constant projecting amount, or a portion having a constant width.

The drawing port 23 is constituted by a first opening 231 and second opening 232 which are formed to be adjacent to the two sides of the projecting portion 22. In other words, the projecting portion 22 is interposed between the first opening 231 and the second opening 232. In the embodiment, the drawing port 23 is formed into a rectangular shape as a whole. By forming the projecting portion 22 at the center of the drawing port 23, the first opening 231 and second opening 232 are formed into axisymmetrical almost trapezoidal shapes when viewed from the top, with respect to an axis passing the center of the projecting portion 22 along the X-axis. Note that the diameters of the first opening 231 and second opening 232 are much larger than the diameter of the above-mentioned pore 25.

The drawing pump 24 is constituted by a vacuum generator, has a drawing end connected to the mount table 21, and draws air in the internal space of the mount table 21 to decrease a pressure in the internal space.

<Arrangement of Suction Device 3>

The suction device 3 includes a base 31 which is supported by a moving unit (not shown) to be movable in the X, Y, and Z directions, and a pickup collet 32 fixed to the base 31. The pickup collet 32 sucks the electronic component D at the suction end and releases the sucked electronic component D by selectively supplying air of a negative or positive pressure from the vacuum generator (not shown).

<Arrangement of Control Device 4>

The control device 4 controls the operation of the overall pickup system by controlling the operations of the holding device 1, separation device 2, and suction device 3. The control device 4 is constituted by a computer including an arithmetic device such as a CPU, a storage device such as a memory or HDD (Hard Disk Drive), an input device which detects an external information input, such as a keyboard, mouse, or touch panel, an I/F device which transmits/receives various kinds of information via a communication line such as the Internet, a LAN (Local Area Network), or a WAN (Wide Area Network), and a display device such as a CRT (Cathode Ray Tube) or LCD (Liquid Crystal Display), and also by a program installed in the computer. These hardware resources and software cooperate with each other to control the hardware resources by the program, implementing various operations by the pickup system (to be described later).

<Operation of Pickup System>

Next, the operation of the pickup system according to the embodiment will be explained.

First, the holding device 1 arranges the wafer sheet S on the mount surface 211a so that the lower surface of the wafer sheet S having an upper surface on which the electronic component (to be also referred to as a "suction target component" hereinafter) D is stuck contacts the mount surface 211a of the separation device 2. At this time, the suction target component D is arranged so that the center of the suction target component D is positioned on a central axis parallel to the X-axis passing the center of the projecting portion 22, and one side of the suction target component D becomes perpendicular to the central axis. In the embodiment, a plurality of electronic components D are continuously arranged on the wafer sheet S. The wafer sheet S is arranged so that an axis passing the center of each electronic component D and the center axis of the projecting portion 22 coincide with each other.

After the wafer sheet S is arranged on the mount surface 211a, the drawing pump 24 starts driving. Since the drawing pump 24 draws air present between the mount surface 211a and the wafer sheet S via the pores 25 formed in the mount table 21, the wafer sheet S tightly contacts the mount surface 211a. In regions where the wafer sheet S is face to face with the first opening 231 and second opening 232, the wafer sheet S is drawn toward the first opening 231 and second opening 232. Note that the drawing pump 24 may be driven before the wafer sheet S is mounted on the mount surface 211a.

After the wafer sheet S tightly contacts the mount surface 211a, the holding device 1 moves the wafer sheet S in the X-axis direction. Then, the suction target component D moves on the upper surface of the projecting portion 22.

Figure 7A:
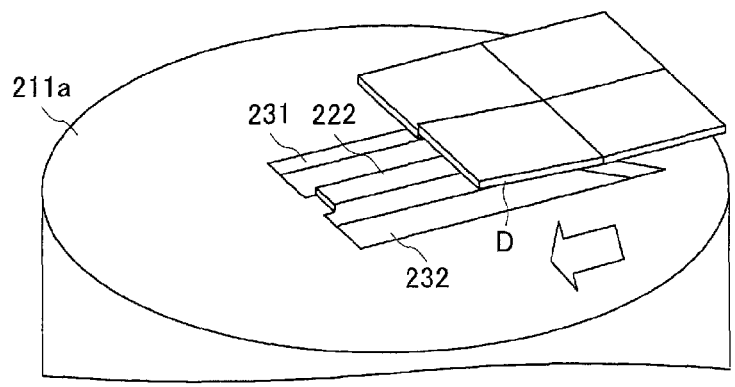
FIGS. 7A to 7C are perspective views for explaining a separation operation.
Figure 7B:
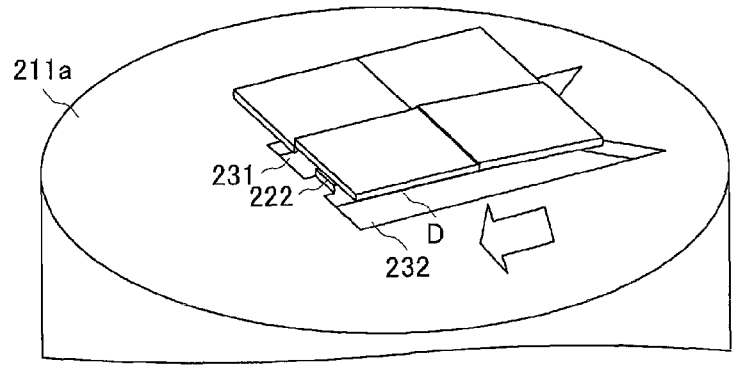

As described above, the holding device 1 moves the wafer sheet S in the X-axis direction so that the center of the suction target component D passes on the center axis of the projecting portion 22. After the suction target component D passes on the upper surface of the sloped portion 221, as shown in FIG. 7A, it reaches the upper surface of the flat portion 222, as shown in FIG. 7B.

As shown in FIG. 4, the width of the projecting portion 22 decreases from the sloped portion 221 toward the flat portion 222. Thus, the area by which the suction target component D moving on the upper surface of the projecting portion 22 contacts (or is face to face with) the projecting portion 22 via the wafer sheet S decreases toward the flat portion 222. This means that the area by which the suction target component D does not contact (or is not face to face with) the projecting portion 22, that is, regions (to be also referred to as "exposed regions" hereinafter) where the suction target component D is exposed toward the first opening 231 and second opening 232 increase toward the flat portion 222. Since the drawing pump 24 is driven, as described above, drawing forces toward the first opening 231 and second opening 232 act on the wafer sheet S sticking to the exposed regions.

As shown in FIG. 5, the projecting amount of the projecting portion 22 increases toward the flat portion 222. The distance between the suction target component D and the mount surface 211a gradually increases as the suction target component D moves toward the flat portion 222. On the wafer sheet S, the difference in height between a region where the wafer sheet S sticks to the suction target component D, and a region where the wafer sheet S is sucked on the mount surface 211a gradually increases. Since the wafer sheet S is formed from an elastic material, as described above, a force toward the mount surface 211a acts on the wafer sheet S sticking to the exposed regions.

In this manner, the wafer sheet S sticking to the exposed regions of the suction target component D is pulled toward the mount surface 211a upon receiving drawing forces from the first opening 231 and second opening 232, and the elastic force of the wafer sheet S itself. As a result, the wafer sheet S is separated from the exposed regions. This separation is performed as follows.

In the embodiment, the plate-like electronic components D having a rectangular shape when viewed from the top are arranged in a matrix. The wafer sheet S moves so that an axis which is parallel to the array direction of the electronic component D and passes the center of the electronic component D coincides with an axis passing the center of the projecting portion 22. Along with this, the electronic component D moves on the sloped portion 221 from one side face to face with the projecting portion 22. At this time, the two end portions of this side are exposed first in the first opening 231 and second opening 232, and a force arising from the above-described drawing force and elastic force concentrates at these two ends. As a result, the wafer sheet S sticking to these two ends is separated first from the suction target component D. As the suction target component D moves, the regions exposed in the first opening 231 and second opening 232 move from the two ends of this side toward central portions. The wafer sheet S is sequentially separated from the exposed portions.

Figure 10:
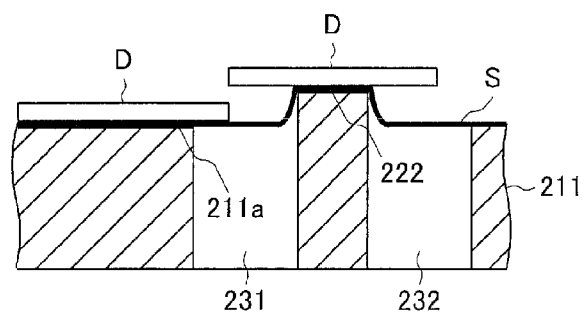
FIG. 10 is a sectional view taken along a line IV-IV in FIG. 8.

Finally, as shown in FIGS. 7B and 10, when the suction target component D reaches the upper surface of the flat portion 222, the wafer sheet S is separated from the suction target component D at a portion except for a region of the electronic component D where it contacts (or is face to face with) the upper surface of the flat portion 222.

Figure 7C:
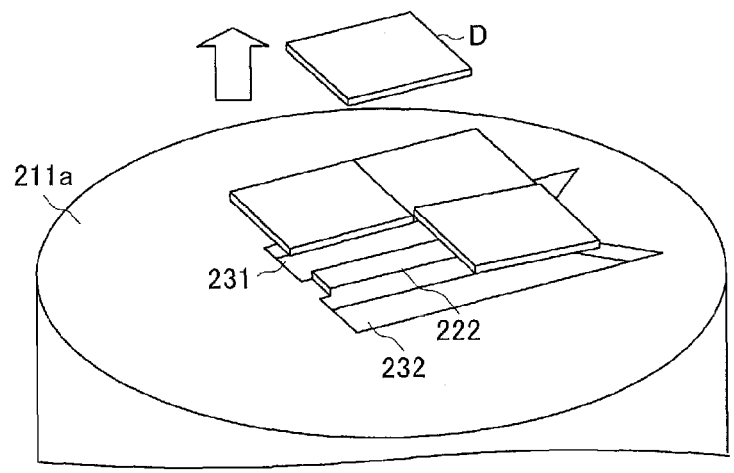
Figure 8:
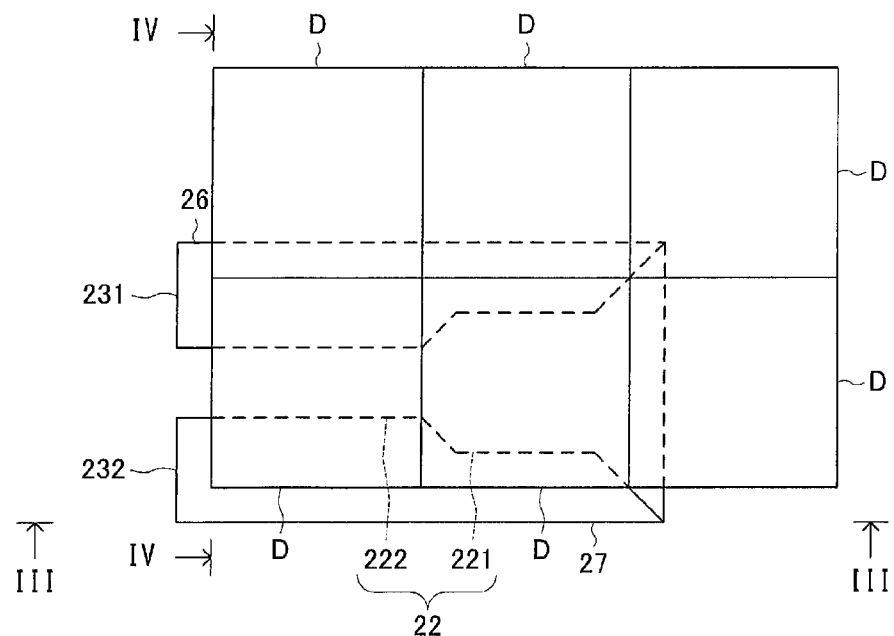
FIG. 8 is a plan view for explaining the separation operation.
Figure 9:
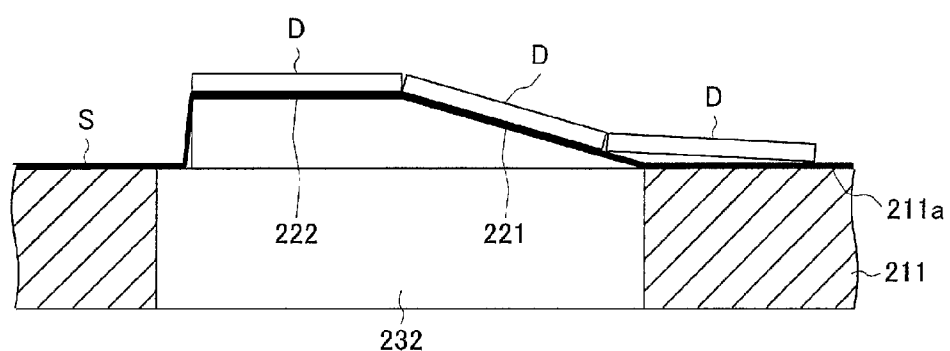
FIG. 9 is a sectional view taken along a line III-III in FIG. 8.

After the suction target component D moves to the upper surface of the flat portion 222, the suction device 3 brings the suction end of the pickup collet 32 close to the suction target component D. A negative pressure is supplied to the pickup collet 32, sucking the suction target component D by the pickup collet 32. The suction device 3 moves up the pickup collet 32 in this state, completely separating the suction target component D from the wafer sheet S, as shown in FIG. 7C. Then, the suction device 3 transports the suction target component D to a predetermined place.

As described above, according to the embodiment, the electronic component D stuck on the wafer sheet S is positioned on the projecting portion 22 via the wafer sheet S, and a negative pressure is applied to the drawing port 23. In response to this, the wafer sheet S sticking to the electronic component D is pulled toward the mount surface 211a, and the electronic component D can be separated from the wafer sheet S without damaging the electronic component D.

The embodiment has exemplified a case in which the projecting portion 22 projecting up from the mount surface 211a is arranged. However, as long as the lower surface of the electronic component D is exposed toward the drawing port 23 when the electronic component D is placed, the structure is not limited to the projecting portion 22, and a free structure such as a step can be arbitrarily arranged. In the case of the step, by mounting the electronic component D at the boundary of the step, the lower surface of the electronic component D can be exposed to the opening side.

Also, the embodiment has exemplified a case in which the projecting amount of the projecting portion 22 increases toward the flat portion 222 with a predetermined gradient. However, the degree of the projecting amount of the sloped portion 221 is not limited to the predetermined gradient. For example, a parabolic shape or stepwise shape may be appropriately freely set.

If the area by which the projecting portion 22 and electronic component D contact each other via the wafer sheet S is smaller than the area of the lower surface of the electronic component D upon mounting the electronic component D on the projecting portion 22, the planar shape of the projecting portion 22 can be appropriately freely designed. In other words, it is only necessary that the area of a region of the projecting portion 22 where it is face to face with the electronic component D via the wafer sheet S is smaller than the area of the lower surface of the electronic component D.

Further, the planar shape of the projecting portion 22 can be appropriately freely designed as long as the width of the above-described region of the projecting portion 22 monotonically decreases in the X-axis direction.

In addition, as long as the wafer sheet S sticking to the lower surface of the electronic component D can be sucked (drawn) while the electronic component D is mounted on the projecting portion 22, the shape and arrangement of the first opening 231 and second opening 232 are not limited to the embodiment, and can be arbitrarily freely designed. This also applies to the number of openings, and the number of openings is not limited to two as in the embodiment.

In the embodiment, a push-up pin may be further arranged. The position at which the push-up pin is arranged suffices to be on the mount table 21, more specifically, on the moving path of the electronic component D on the mount table 21, e.g., near the sloped portion 221, on the sloped portion 221, or on the flat portion 222.

Figure 11:
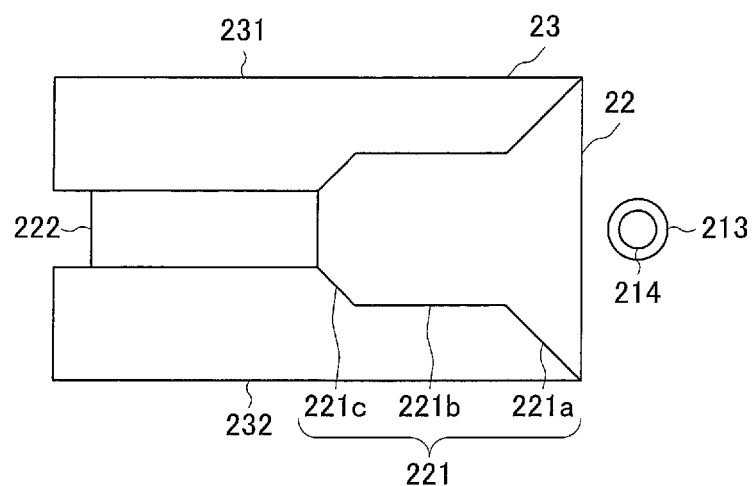
FIG. 11 is a plan view showing the first modification of the separation device.

For example, as shown in FIG. 11, an opening 213 formed near the sloped portion 221 of the mount table 21, and a push-up pin 214 projecting from the opening 213 may be arranged. In this case, when the electronic component D stuck on the wafer sheet S passes on the opening 213 in order to move from the mount surface 211a to the sloped portion 221, the push-up pin 214 slightly pushes up the electronic component D via the wafer sheet S. Then, the electronic component D moves up, and part of the wafer sheet S sticking to the lower surface of the electronic component D, especially, a portion sticking to the edge of the electronic component D is separated. When the electronic component D moves on the projecting portion 22, part of the wafer sheet S has already been separated from the electronic component D. Thus, the electronic component D can be more easily separated from the wafer sheet S.

Figure 12:
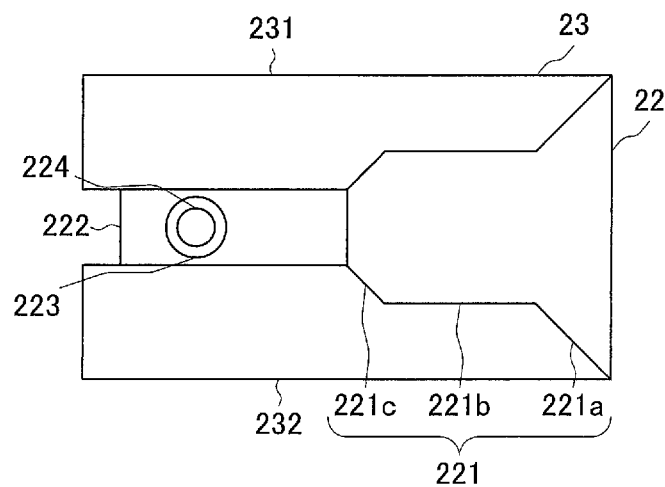
FIG. 12 is a plan view showing the second modification of the separation device.
Figure 13:
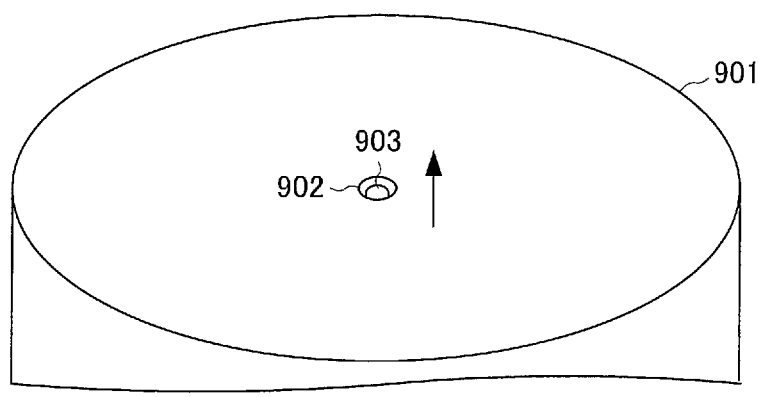
FIG. 13 is a perspective view showing a suction stage related to the present invention.
Figure 14:
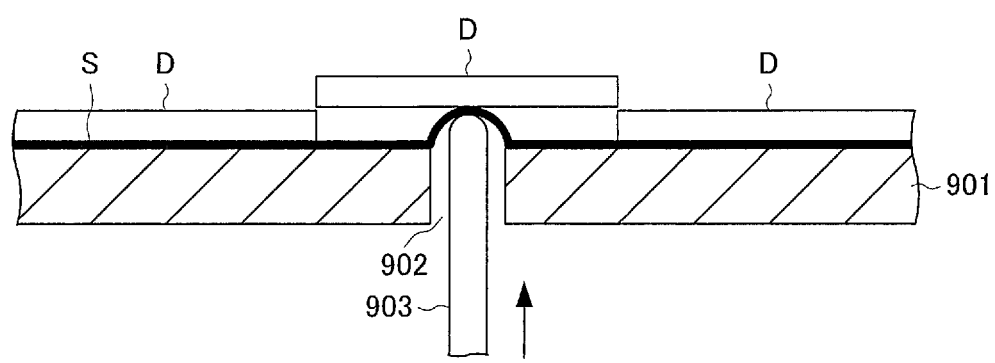
FIG. 14 is a sectional view showing the suction stage related to the present invention.

Alternatively, as shown in FIG. 12, an opening 223 formed at the flat portion 222 of the projecting portion 22, and a push-up pin 224 projecting from the opening 223 may be arranged. In this case, first, a negative pressure is applied to the drawing port 23. Then, the electronic component D stuck on the wafer sheet S is moved from the sloped portion 221 of the projecting portion 22 to the flat portion 222 to separate, from the electronic component D, the wafer sheet S at a portion except for a region of the electronic component D where it contacts the upper surface of the flat portion 222. After that, the push-up pin 224 pushes up the lower surface of the electronic component D via the wafer sheet S. As a result, the electronic component D can be separated from the wafer sheet S. When pushing up the electronic component D, part of the wafer sheet S has already been separated from the electronic component D. Hence, the electronic component D can be separated without applying a strong force by the push-up pin 224. This can prevent damage to the electronic component D.

The present invention is applicable to various devices for picking up an electronic component from a pressure sensitive adhesive sheet on which an electronic component is stuck.

What is claimed is:

1. A separation device comprising:
   a mount table including a mount surface on which a pressure sensitive adhesive sheet, on which an electronic component is stuck, is mounted, the electronic component being stuck on one surface of the pressure sensitive adhesive sheet and the mount surface being in contact with the other surface of the pressure sensitive adhesive sheet;
   a holding device, which holds the pressure sensitive adhesive sheet and moves the pressure sensitive adhesive sheet in a first direction parallel to the mount surface;
   a projecting portion, which is fixed onto the mount surface and projects toward the pressure sensitive adhesive sheet mounted on the mount surface, the projecting portion having a length in the first direction longer than a length of the projecting portion in a second direction parallel to the mount surface and perpendicular to the first direction; and
   a drawing port which is open near the projecting portion on the mount surface, and when a negative pressure is applied, draws the pressure sensitive adhesive sheet.

2. The device according to claim 1, wherein an area of a region of the projecting portion where the projecting portion is face to face with the electronic component via the pressure sensitive adhesive sheet is smaller than an area of a base of the projecting portion.

3. The device according to claim 2, wherein the projecting portion extends in the first direction, and the projecting portion includes a sloped portion of which an amount of projection increases in the first direction.

4. The device according to claim 3, wherein the projecting portion includes a portion of which the length in the second direction decreases in the first direction.

5. The device according to claim 2, wherein the drawing port includes a first opening and a second opening which are formed on two sides of the projecting portion extending in the first direction.

6. The device according to claim 1, further comprising a push-up pin which is formed on the mount table and pushes up the electronic component via the pressure sensitive adhesive sheet.

7. A pickup system comprising:
   a pressure sensitive adhesive sheet having one surface on which an electronic component is stuck;
   a holding device, which movably holds the pressure sensitive adhesive sheet;
   a separation device, which separates the electronic component from the pressure sensitive adhesive sheet; and
   a suction device, which sucks the electronic component separated by the separation device,
   the separation device including:
      a mount table including a mount surface on which the pressure sensitive adhesive sheet is mounted to bring the other surface of the pressure sensitive adhesive sheet into contact with the mount surface;
      a projecting portion, which is fixed onto the mount surface and projects toward the pressure sensitive adhesive sheet mounted on the mount surface, the projecting portion having a length in a first direction parallel to the mount surface longer than that of the electronic component and the projecting portion having a length in a second direction parallel to the mount surface and perpendicular to the first direction shorter than that of the electronic component; and
      a drawing port which is open near the projecting portion on the mount surface, and when a negative pressure is applied, draws the pressure sensitive adhesive sheet,
   wherein the holding device is configured to move the pressure sensitive adhesive sheet in the first direction.

* * * * *